United States Patent
Bulur et al.

(10) Patent No.: US 9,966,773 B2
(45) Date of Patent: May 8, 2018

(54) MODULAR BATTERY CELL ARCHITECTURE AND CONTROL METHOD

(71) Applicant: Lenovo Enterprise Solutions (Singapore) Pte. Ltd., Singapore (SG)

(72) Inventors: Yakup Bulur, Rochester, MN (US); Richard J. Fishbune, Rochester, MN (US); Mark E. Maresh, Cave Creek, AZ (US); Neil C. Swenson, Rochester, MN (US); Adam M. Wheeler, Rochester, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days. days.

(21) Appl. No.: 15/228,340

(22) Filed: Aug. 4, 2016

(65) Prior Publication Data

US 2016/0344207 A1    Nov. 24, 2016

Related U.S. Application Data

(63) Continuation of application No. 14/310,506, filed on Jun. 20, 2014, now Pat. No. 9,438,048.

(51) Int. Cl.
*H02J 7/00* (2006.01)
*G01R 31/36* (2006.01)

(52) U.S. Cl.
CPC .......... *H02J 7/0026* (2013.01); *H02J 7/0019* (2013.01); *H02J 7/0021* (2013.01);
(Continued)

(58) Field of Classification Search
CPC ........ H02J 7/0021; H02J 7/007; H02J 7/0026; G01R 31/3658; G01R 31/3679
(Continued)

(56) References Cited

U.S. PATENT DOCUMENTS

| 3,663,931 A | 5/1972 | Brown |
| 4,149,764 A | 4/1979 | Mattingly |

(Continued)

FOREIGN PATENT DOCUMENTS

| CA | 2603912 | 10/2006 |
| CN | 1378307 A | 11/2002 |

(Continued)

OTHER PUBLICATIONS goelectricdrive.com, A123 Video Presenting Prismatic Battery Pack, Jun. 14, 2011, p. 1-4.
(Continued)

*Primary Examiner* — Sun Lin
(74) *Attorney, Agent, or Firm* — Lieberman & Brandsdorfer, LLC

(57) ABSTRACT

Embodiments of the invention relate to a multi-cell battery, with at least two cells electrically connected in a first parallel arrangement, which is connected in series to a second parallel arrangement of at least two additional cells. Each cell is locally connected to a sensor to sense and control current of each cell in parallel or parallel-series combination in the multi-cell battery. A control module is in communication with each sensor, and associated instructions electrically remove or disable a cell from the multi-cell battery determined to be defective based on measurements from the associated sensor. A configuration performs measurements and monitors a state of health of each cell in the multi-cell battery, the measurements including temperature, voltage and current sensing. Identifying one cell of the cells in the multi-cell battery as subject to a performance failure results in electrically switching the identified cell to an off position.

15 Claims, 5 Drawing Sheets

(52) U.S. Cl.
CPC ...... *G01R 31/3658* (2013.01); *G01R 31/3679* (2013.01); *H02J 7/007* (2013.01); *Y02T 10/7055* (2013.01)

(58) Field of Classification Search
USPC ........................................................ 320/112
See application file for complete search history.

(56) References Cited

U.S. PATENT DOCUMENTS

| | | | |
|---|---|---|---|
| 4,552,422 A | 11/1985 | Bennett et al. | |
| 4,867,691 A | 9/1989 | Eck | |
| 5,367,431 A | 11/1994 | Kunishi et al. | |
| 5,411,400 A | 5/1995 | Subrahmanyan et al. | |
| 5,460,531 A | 10/1995 | Vivio | |
| 5,825,630 A | 10/1998 | Taylor et al. | |
| 5,940,263 A | 8/1999 | Jakoubovitch | |
| 6,014,013 A | 1/2000 | Suppanz et al. | |
| 6,027,828 A | 2/2000 | Hahn | |
| 6,146,778 A | 11/2000 | Rouillard et al. | |
| 6,268,711 B1 | 7/2001 | Bearfield | |
| 6,773,848 B1 | 8/2004 | Nortoft et al. | |
| 7,108,940 B2 | 9/2006 | Sharrow et al. | |
| 7,198,866 B2 | 4/2007 | Miyamoto et al. | |
| 7,816,055 B2 | 10/2010 | Jacobson et al. | |
| 7,960,054 B2 | 6/2011 | Zhang et al. | |
| 8,207,740 B2 | 6/2012 | Lin et al. | |
| 8,547,065 B2 | 10/2013 | Trigiani | |
| 8,872,474 B2 | 10/2014 | Scheucher | |
| 9,007,025 B2 | 4/2015 | Miller et al. | |
| 9,130,377 B2 | 9/2015 | Barsukov et al. | |
| 9,219,366 B2* | 12/2015 | Kim | H02J 7/00 |
| 9,438,048 B2* | 9/2016 | Bulur et al. | H02J 7/0021 |
| 2002/0175655 A1 | 11/2002 | Huykman et al. | |
| 2003/0036311 A1 | 2/2003 | Benson et al. | |
| 2006/0108081 A1 | 5/2006 | Onic et al. | |
| 2006/0267546 A1 | 11/2006 | Shen et al. | |
| 2007/0105409 A1 | 5/2007 | Brekosky et al. | |
| 2008/0166926 A1 | 7/2008 | Seymour et al. | |
| 2008/0207015 A1 | 8/2008 | Sueyoshi | |
| 2009/0284076 A1 | 11/2009 | Lin et al. | |
| 2010/0013430 A1 | 1/2010 | Manor et al. | |
| 2010/0029103 A1 | 2/2010 | Costello | |
| 2010/0134305 A1 | 6/2010 | Lu et al. | |
| 2011/0003182 A1 | 1/2011 | Zhu | |
| 2011/0117417 A1 | 5/2011 | Pitts | |
| 2011/0140650 A1 | 6/2011 | Zhang et al. | |
| 2012/0038315 A1 | 2/2012 | Wong | |
| 2012/0242144 A1 | 9/2012 | Chorian et al. | |
| 2012/0244390 A1 | 9/2012 | Cheng et al. | |
| 2012/0249055 A1 | 10/2012 | Wade | |
| 2012/0256592 A1 | 10/2012 | Baughman | |
| 2012/0290234 A1 | 11/2012 | Schaefer | |
| 2013/0119935 A1 | 5/2013 | Sufrin-Disler et al. | |
| 2013/0258830 A1 | 10/2013 | Yoda | |
| 2013/0261815 A1 | 10/2013 | Suzuki | |
| 2015/0372515 A1* | 12/2015 | Bulur et al. | H02J 7/0021 320/112 |

FOREIGN PATENT DOCUMENTS

| | | |
|---|---|---|
| CN | 102098357 A | 6/2011 |
| DE | 19624887 | 1/1997 |
| EP | 507977 | 10/1992 |
| EP | 000588615 A2 | 3/1994 |
| EP | 932214 | 7/1999 |
| EP | 2375539 A2 | 10/2011 |
| WO | 95026053 | 9/1995 |
| WO | 2007134320 | 11/2007 |
| WO | 2009128079 | 10/2009 |

OTHER PUBLICATIONS

Bonfiglio et al, A Cost Optimized Battery Management System with Active Cell Balancing for Lithium Ion Battery Stacks, Infineon Technologies AG, 2009, pp. 304-309.

Ecamion Inc., Lithium Modular Battery Pack, 2009, p. 1-9.

Ocean Server Technology, Inc. Large Sized Battery Power Systems, Battery Cluster Building Blocks, 2004, p. 1-6.

* cited by examiner

MODULAR BATTERY CELL ARCHITECTURE AND CONTROL METHOD

CROSS-REFERENCE TO RELATED APPLICATION(S)

This application is a continuation of U.S. patent application Ser. No. 14/310,506, filed Jun. 20, 2014, titled "Modular Battery Cell Architecture and Control Method", which is hereby incorporated by reference.

BACKGROUND

The present invention relates to multi-cell battery architecture. More specifically, the invention relates to managing current flow at an individual cell level in the multi-cell architecture.

A battery is a device placed inside an electronic machine and functions to supply the machine with electrical energy. The use and evolution of batteries has grown with the use of complex electronic devices. Today, a battery pack with multiple cells is provided to power complex electronic devices. For example, with respect to hybrid and battery operated vehicles, battery packs are known to consist of hundreds or thousands of individual lithium-ion cells within the pack.

The configuration of a multi-cell battery pack requires a control mechanism for management of the pack or the cells within the pack. For example, it is known in the art to measure and control voltage within the multi-cell battery pack. However, the current state of measurement and control is inadequate, which in effect causes reduction of the cell life as well as potential safety issues with respect to thermal runaway.

SUMMARY

The invention includes a method, computer program product, and system for sensing and controlling the current of each cell in a battery pack.

A method, computer program product, and system are provided for controlling current in a battery pack having a modular cell architecture. The pack is arranged with multiple cells, the cells arranged in a parallel configuration with each cell electrically connected to a current sensor in series. More specifically, a first cell is provided in communication with a first current sensor and a second cell is provided in communication with a second current sensor. Each current sensor measures current of an associated cell, including the first current sensor measuring current through the first cell and the second current sensor measuring current through the second cell. Current flow in each individual cell within the pack is controlled responsive to the current sensed at the individual cell. The control of the current includes balancing current flow in each cell in the battery pack. Upon identifying one of the multiple cells as subject to a performance failure, the identified cell is electrically switched to an off position.

These and other features and advantages of this invention will become apparent from the following detailed description of the presently preferred embodiment(s) of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
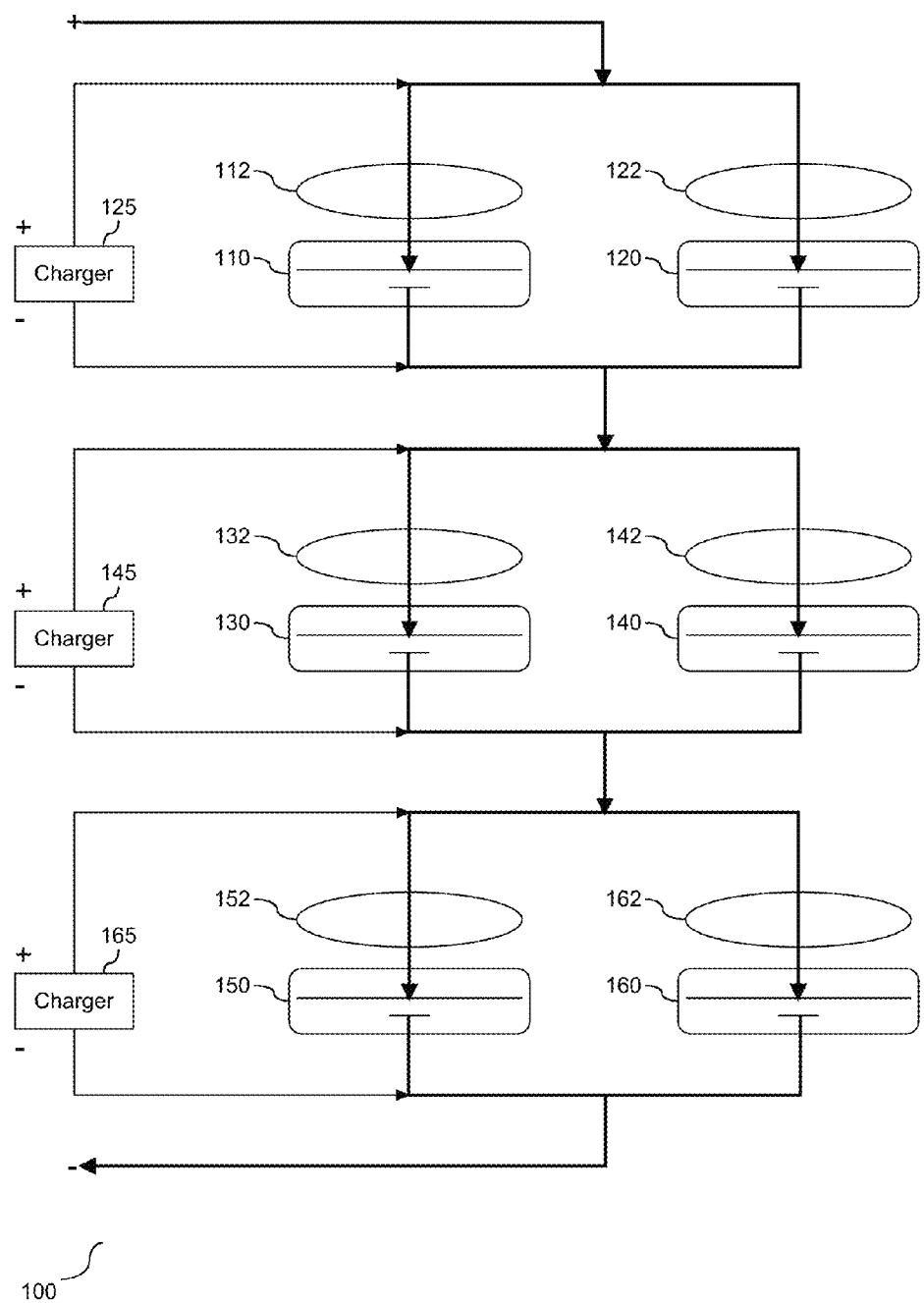
FIG. 1 depicts a block diagram illustrating a multi-cell battery, and specifically the electrical arrangement of the cells in the battery.

With reference to FIG. 1, a block diagram (100) is provided illustrating a multi-cell battery, and specifically the electrical arrangement of the cells in the battery. In the example shown herein, there are six cells, although the quantity should not be considered limiting. The arrangement of the cells is referred to herein as a parallel series configuration. As shown, a first cell (110) is arranged in parallel with a second cell (120). The first cell (110) is in communication with a first current sensor (112), and the second cell (120) is in communication with a second current sensor (122). Each current sensor functions to sense current charge or discharge that goes through each cell in the battery. More specifically, the first current sensor (112) functions to sense current charge or discharge through the first cell (110), and the second current sensor (122) functions to sense current charge or discharge through the second cell (120). In addition, as shown herein a first charger (125) is electrically connected to the first and second cells (110) and (120), respectively. The arrangement of the first and second cells (110) and (120) are referred to herein as a first parallel arrangement.

The parallel arrangement of the first and second cells (110) and (120) are electrically connected in series to a second parallel arrangement of cells. As shown, the second parallel arrangement includes a third cell (130) and a fourth cell (140). Similar to the first parallel arrangement, the third cell (130) is in communication with a third current sensor (132), and the fourth cell (140) is in communication with a fourth current sensor (142). The third current sensor (132) functions to sense current charge or discharge through the third cell (130), and the fourth current sensor (142) functions to sense current charge or discharge through the fourth cell (140). In addition, as shown herein a second charger (145) is electrically connected to the third and fourth cells (130) and (140), respectively. The arrangement of the third and fourth cells (130) and (140) are referred to herein as the second parallel arrangement.

The parallel arrangement of the third and fourth cells (130) and (140) are electrically connected in series to a third parallel arrangement of cells. As shown, the third parallel arrangement includes a fifth cell (150) and a sixth cell (160). Similar to the first and second parallel arrangements, the fifth cell (150) is in communication with a fifth current sensor (152), and the sixth cell (160) is in communication with a sixth current sensor (162). The fifth current sensor (152) functions to sense current charge or discharge through the fifth cell (150), and the sixth current sensor (162) functions to sense current charge or discharge through the sixth cell (160). In addition, as shown herein a third charger (165) is electrically connected to the fifth and sixth cells (150) and (160), respectively. The arrangement of the fifth and sixth cells (150) and (160) are referred to herein as a third parallel arrangement.

The arrangement shown in FIG. 1, is a matrix of cells that includes three rows and two columns of cells. Each row in the matrix represents one of the parallel arrangements. As shown, each cell in each parallel arrangement of cells has a local current sensor. Furthermore, each parallel arrangement of cells is connected in series to another parallel arrangement. As shown, the first parallel arrangement is connected in series to the second parallel arrangement, which is connected in series to the third parallel arrangement.

Figure 2:
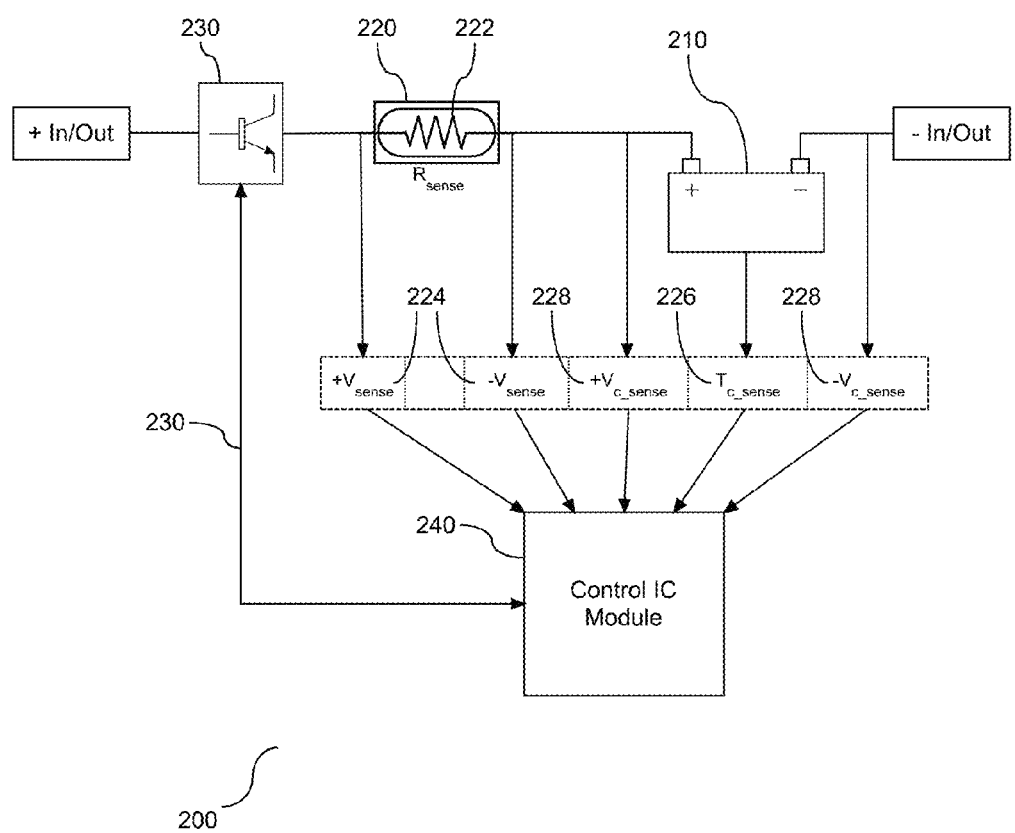
FIG. 2 depicts an electrical circuit diagram showing a modular cell within the battery pack.

Referring to FIG. 2, an electrical circuit diagram (200) is provided showing a modular cell within the battery pack. As shown, the cell (210) is in communication with a current sensor (220), which is in communication with a charge current control circuit (230). The current sensor (220) gathers data, and in one embodiment senses the voltage change across a resistor (222). In one embodiment, a lossless inductive coupler may replace the functionality of the resistor (222). Additionally, the individual cell voltage level (228) and the individual cell temperature level (226) are measured. These measurements (228) and (226), and the voltage change measured across the resistor (224) by the current sensor (220) are communication to a control module (240). In one embodiment, the measurements (228) and (226) are communicated to the control module (240) via an analog signal from the cell, and the voltage change (224) measured by the resistor (222) is communicated to the control module (240) from the current sensor (220). In one embodiment, the control module (240) is an integrated circuit. The control module (240) functions to convert voltage change received from the current sensor into a current measurement. Furthermore, the control module (240) communicates with the charge current control circuit (230) to indicate how much current to allow into the cell (210). For example, the charge rate for the cell (210) may be reduced to reduce the temperature. At the same time, the control circuit (230) provides feedback to the control module (240) to manage charge and discharge of the cell (210). Accordingly, the circuit is a closed loop circuit for a single cell in the multi-cell arrangement shown in FIG. 1 to manage current for each cell, and specifically to direct how much current can flow into the cell.

Figure 3:
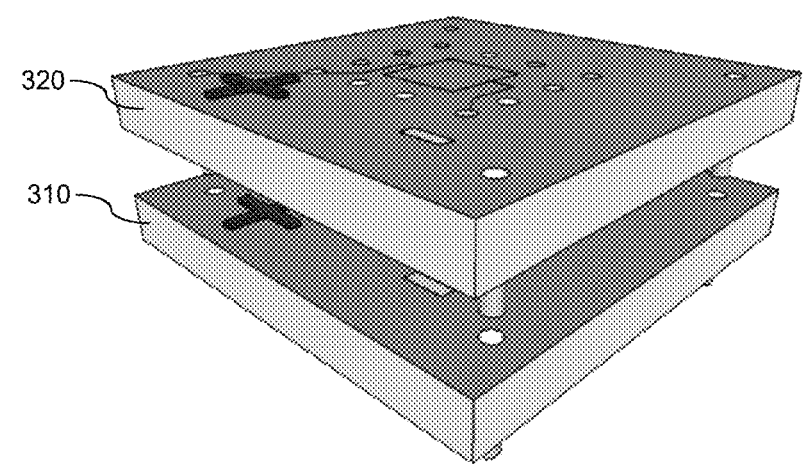
FIG. 3 depicts a diagram showing a modular multi-cell battery.

Referring to FIG. 3, diagram (300) is provided showing a modular multi-cell battery. As shown, the example includes two modules (310) and (320) arranged in parallel. In one embodiment, a plurality of modules may be stacked in parallel, and the quantity shown herein should not be considered limiting. Each module (310) and (320) includes the circuitry shown and described in FIG. 2, and as such, each cell charge current, temperature, and voltage can be sensed and controlled. The parallel stack of cell modules (310) and (320) can be connected in series to another parallel stack of cell modules to form the parallel—series combination arrangement as shown in FIG. 1.

Figure 4:
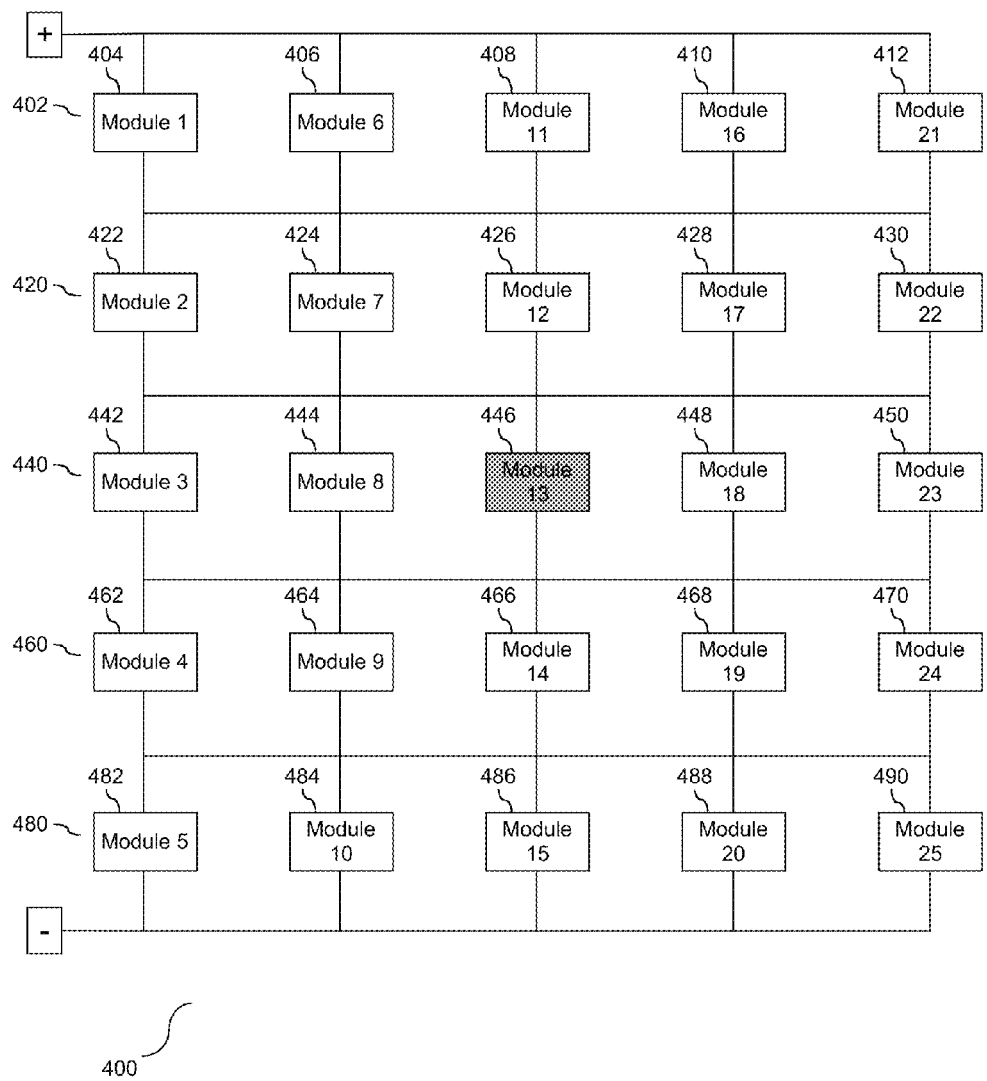
FIG. 4 depicts a diagram of the modular configuration of a multi-cell battery.

Referring to FIG. 4, a diagram (400) of the modular configuration of a multi-cell battery is provided. The battery (400) is arranged in a matrix with a plurality of cells. In the embodiment shown herein, the matrix includes five rows and five columns. Each row is a parallel arrangement of cells, such that each cell in the row is connected to each other cell in the same row via a parallel connection. Similarly, each column is connected to each other column in the matrix via a series connection. In the first row (402), there are five modules (404), (406), (408), (410), and (412). Each of these modules is electrically connected in parallel. The second row (420) includes five modules (422), (424), (426), (428), and (430). Each of these modules is electrically connected in parallel. In addition, the modules of the first row (402) are connected in series to the modules of the second row (420). A similar arrangement is provided for the third row (440), with five modules (442), (444), (446), (448), and (450), each electrically connected in parallel, and the third row (440) connected in series with the first and second rows (402) and (420), respectively. The fourth row (460) is shown with five modules (462), (464), (466), (468), and (470), also connected in parallel with the fourth row connected in series with the first, second and third rows, (402), (420), and (440). The fifth row (480) is shown with five modules (482), (484), (486), (488), and (490), each connected in parallel, with the fifth row (480) connected in series with the first, second, third, and fourth rows (402), (420), (440), and (460).

One of the modules in the matrix may be subject to performance failure. In the example shown herein, module (446) is determined not to perform up to a predetermined measurement or standard, e.g. determined to be a bad module. A switch connecting module (446) to the battery (400) is opened so that this module is electrically switched off, e.g. is taken offline. By taking module (446) offline, the battery (400) remains functional and module (446) does not degrade voltage of the other modules. In one embodiment, the capacity of the battery is reduced by twenty percent by taking one module in one row offline. Similarly, in an embodiment, where two modules in the same rows are taken offline, the capacity of the battery (400) is reduced by forty percent. In an embodiment where two modules are taken offline and each of these modules are in separate rows, the capacity of the module is only reduced by twenty percent. The capacity only reduces further if two or more modules from the same row are taken offline.

Figure 5:
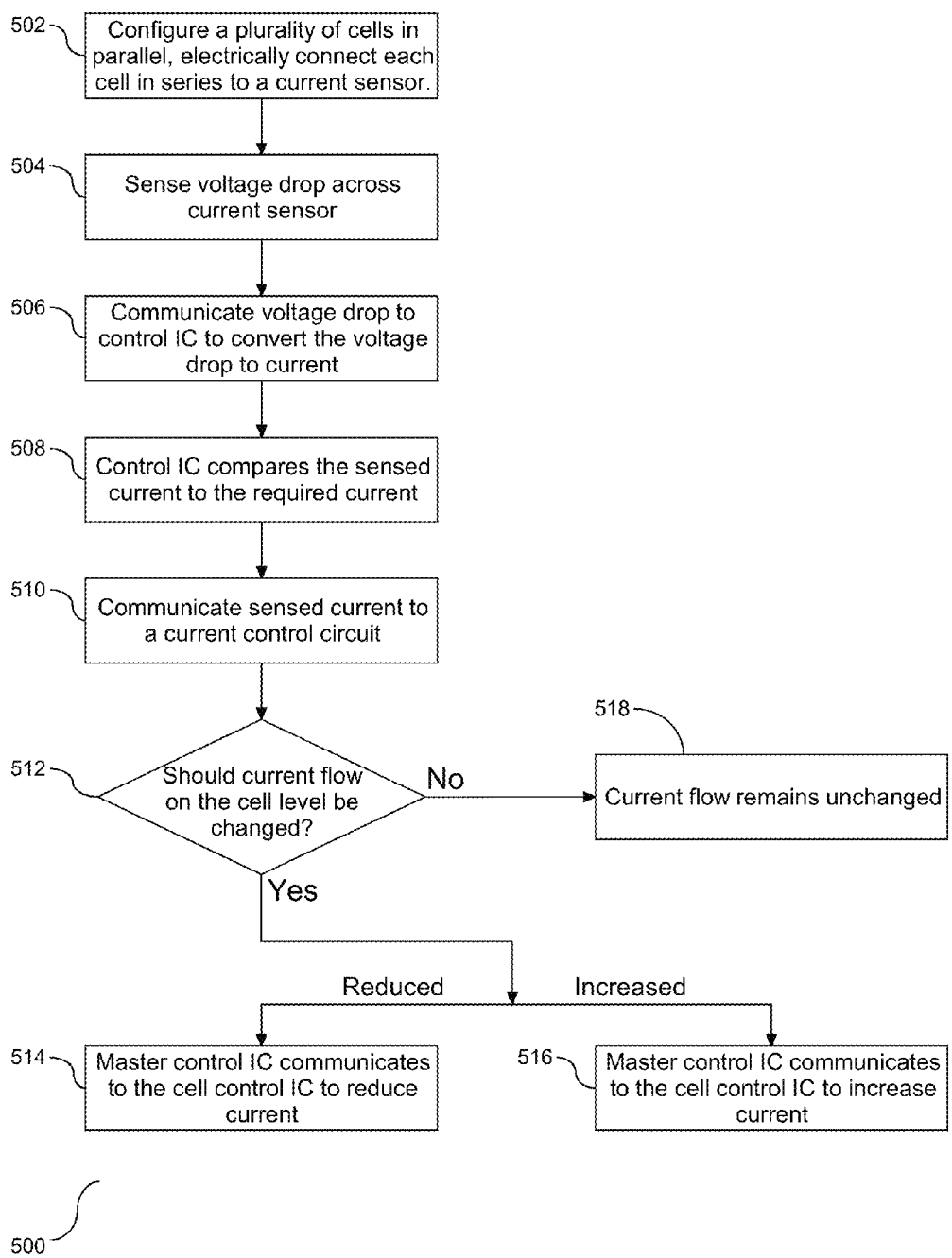
FIG. 5 depicts a flow chart illustrating one embodiment for an algorithm for current control of a multi-cell battery.

Referring to FIG. 5, a flow chart (500) is provided illustrating one embodiment for an algorithm for current control of a multi-cell battery. A plurality of cells in the battery is configured in a parallel arrangement, with each cell electrically connected to a series current sensor (502). When current flows in or out from the cell, a voltage drop within the sensor is detected. The voltage drop detection is based on a current sense resistor. In one embodiment, a loss less current transducer, similar to an inductor, may be used in place of the current sense resistor. In the embodiment shown and described herein, this voltage drop can be used to calculate the magnitude of the current. As shown, the voltage drop across the current sensor is sensed (504), and this sensed voltage is communicated to a control integrated circuit, herein after referred to as the control IC, to convert the voltage drop to current (506). The control IC compares the sensed current to the required current of the individual cell (508), and communicates the sensed current information to a current control circuit (510), also referred to herein as a master control integrated circuit. The control circuit determines whether the current flow at the cell level should be changed (512), e.g. reduced or increased. The change at step (512) reflects balancing current flow in each parallel cell. Accordingly, the master control integrated circuit compares all current information collected from each cell in the parallel configuration.

The master control integrated circuit, hereinafter referred to as the master control IC, balances the current flow for each parallel cell by communicating with the cell control IC to reduce or increase current. If at step (512) it is determined that the current flow of at least one of the cells in the parallel arrangement should be reduced, the master control IC, communicates to the cell control IC to reduce the current (514). Similarly, if at step (512) it is determined that the current flow of at least one of the cells in the parallel arrangement should be increased, the master control IC, communicates to the cell control IC to increase the current (516). In one embodiment, in addition to current sensed information being passed to the master control IC, temperature and voltage and other information from each cell module may be passed to the master control IC for monitoring, control, and analytics purposes. The reduction or increase of the current at step (514) and (516), respectively, includes the cell control module opening the circuit at the cell module level. The opening of the circuit may be permanent or temporary. This allows for extension of the battery life at a slightly reduced capacity. In one embodiment, the control of the individual cells demonstrated herein is referred to as a self-healing technique. Alternatively, at step (512), it may be determined that the cells are operating at a healthy level and the current flow remains unchanged (518). Accordingly, if a single cell or multiple cells in the series-parallel configuration are subject to failure, the whole battery system continues to operate at reduced capacity.

As shown in FIGS. 1-5, multiple cellular characteristics are sensed, including current, voltage, and temperature, for each individual cell in a multi-cell battery having a parallel-series arrangement. Each of these characteristics is sensed at each cell in the parallel configuration. As shown in FIG. 5, the current is controlled at the cellular level based on the sensed characteristics. The current sensor at the cellular level enables any one of the cells to be isolated. For example, in one embodiment, one of the individual cells can be switched off in response to one of the sensed characteristics indicating a reduction in the current. In one embodiment, the characteristics being sensed supports early detection of a bad cell, which may provide a safer operating environment. In one embodiment, the current control demonstrated herein at the cellular level mitigates thermal runaway. Accordingly, the state of health of each cell in the modular configuration is measured and monitored, and in the event of switching off of any one of the cells, or otherwise removing or disabling any one of the cells, the operation of the battery continues at a reduced capacity.

The cellular arrangement of the battery is a fixed matrix configuration. Control of the cells is supported by one or more integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring to FIGS. 1-5, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions, or acts or carry out combinations of special purpose hardware and computer instructions.

The terminology used herein is for the purpose of describing particular embodiments only, and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step-plus-function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles and the practical application of the invention, and to enable others of ordinary skill in the art to understand the invention for various embodiments with various modifications as are suited to the particular use contemplated. For each cell in the matrix, the current is both sensed and controlled, and as demonstrated herein the battery life is extended. As demonstrated, the battery continues to operate at a reduced capacity by electrically removing or disabling a cell identified as defective, without shutting down the battery pack in its entirety. Accordingly, the implementation allows measurement and monitoring of the state of health of each cell in the battery pack, including temperature, voltage, and current sensing.

It will be appreciated that, although specific embodiments of the invention have been described herein for purposes of illustration, various modifications may be made without departing from the spirit and scope of the invention. In particular, the matrix of cells shown and described herein should not be considered limiting. In one embodiment, the matrix may be configured with an expanded quantity of rows and/or columns. As the size of the matrix configuration grows, the impact on the functionality of the battery of removing cells off-line is reduced. Accordingly, the scope of protection of this invention is limited only by the following claims and their equivalents.

We claim:
1. A method comprising:
arranging a battery pack with multiple cells, the multiple cells arranged in a parallel configuration with each cell electrically connected in series to a current sensor, including a first cell in communication with a first current sensor and a second cell in communication with a second current sensor;

using each respective current sensor in measuring current at an associated cell in the battery pack, including the first current sensor measuring current through the first cell and the second current sensor measuring current through the second cell;

controlling current flow in each individual cell within the battery pack responsive to the current measured at each individual cell, including balancing current flow in each cell in the battery pack; and in response to identifying one cell of the multiple cells as subject to a performance failure, electrically switching the identified cell to an off position.

2. The method of claim 1, further comprising opening a switch connecting module to take the identified cell to an offline state.

3. The method of claim 1, further comprising the battery pack remaining functional with a reduced capacity in response to switching the identified cell to the off position.

4. The method of claim 1, wherein voltage of each remaining cell in the battery pack does not degrade in response to switching the identified cell to the off position.

5. The method of claim 1, wherein the controlling current flow includes a cell control module local to an identified cell manipulating a circuit at a cell module level, the manipulating selected from the group consisting of: opening the circuit and closing the circuit.

6. A computer program product for controlling current flow in each cell of multiple cells in a battery pack, the computer program product comprising a computer readable storage device having program code embodied therewith, the program code executable by a processor to:

measure current at an associated cell in a battery pack, the battery pack including multiple cells arranged in a parallel configuration with each cell electrically connected in series to a current sensor, including a first cell in communication with a first current sensor and a second cell in communication with a second current sensor to perform current measurements, the current measurements including the first current sensor measuring current through the first cell and the second current sensor measuring current through the second cell;

control current flow in each individual cell within the battery pack responsive to the current measured at each individual cell, including the processor to balance current flow in each cell in the battery pack; and electrically switch an identified cell to an off position in response to identification of one cell of the multiple cells as subject to a performance failure.

7. The computer program product of claim 6, further comprising program code executable by the processor to open a switch connecting module to take the identified cell to an offline state.

8. The computer program product of claim 6, further comprising program code executable by the processor to retain functionality of the battery pack at a reduced capacity upon switching the identified cell to the off position.

9. The computer program product of claim 6, wherein voltage of each remaining cell in the battery pack does not degrade in response to the processor switching the identified cell to the off position.

10. The computer program product of claim 6, wherein the program code executable by the processor to control current flow further includes the processor to perform a manipulation on a circuit of a cell control module local to an identified cell, the manipulation selected from the group consisting of: opening the circuit and closing the circuit.

11. A system comprising:

an arrangement of a battery pack with multiple cells, the multiple cells arranged in a parallel configuration with each cell electrically connected in series to a current sensor, the arrangement including a first cell in communication with a first current sensor and a second cell in communication with a second current sensor;

each respective current sensor to measure current at an associated cell in the battery pack, including the first current sensor to measure current through the first cell and the second current sensor to measure current through the second cell;

a control mechanism to control current flow in each individual cell within the battery pack responsive to the current measured at each individual cell, including a mechanism to balance current flow in each cell in the battery pack; and a switch to electrically change a failed cell to an off position upon identification of the failed cell as a cell that has been subjected to a performance failure.

12. The system of claim 11, further comprising a switch connecting module, the switch connecting module to open and change the failed cell to an offline state upon the identification of the failed cell as subject to a performance failure.

13. The system of claim 11, wherein the battery pack remains functional at a reduced capacity upon the switch changing the failed cell to the off position.

14. The system of claim 11, wherein voltage of each remaining cell in the battery pack does not degrade in response to changing the failed cell to the off position.

15. The system of claim 11, further comprising a cell control module local to each cell, the control mechanism to to perform a manipulation on a circuit of each cell through an associated cell control module, the manipulation selected from the group consisting of: opening the circuit and closing the circuit.

* * * * *